United States Patent [19]

Bertsche et al.

[11] Patent Number: 5,522,767
[45] Date of Patent: Jun. 4, 1996

[54] METHOD OF GUIDING AIR IN AN ACCOMMODATION SPACE AND APPARATUS FOR DEALING WITH SMALL PARTS

[75] Inventors: Thomas Bertsche, Rielasingen-Worblingen; Christoph von Stenglin, Radolfzell; Ewald Springmeier, Wuppertal, all of Germany

[73] Assignee: Metall + Plastic GmbH, Radolfzell, Germany

[21] Appl. No.: 235,901

[22] Filed: May 2, 1994

Related U.S. Application Data

[63] Continuation of Ser. No. 175,101, Dec. 29, 1993, abandoned.

[30] Foreign Application Priority Data

Dec. 31, 1992 [DE] Germany .............................. 9217873 U

[51] Int. Cl.⁶ ..................................................... F24F 7/007
[52] U.S. Cl. .............................................. 454/187; 454/57
[58] Field of Search .............................. 55/385.2; 454/56, 454/57, 61, 62, 187

[56] References Cited

U.S. PATENT DOCUMENTS

| | | | |
|---|---|---|---|
| 3,745,908 | 7/1973 | Mayberry | 454/57 |
| 3,895,570 | 7/1975 | Eagleson, Jr. | 454/57 |
| 4,304,224 | 12/1981 | Fortney | 454/187 X |
| 4,549,472 | 10/1985 | Endo et al. | 454/187 |
| 5,195,922 | 3/1993 | Genco | 454/57 |
| 5,326,316 | 7/1994 | Hashimoto et al. | 454/187 |

*Primary Examiner*—Harold Joyce
*Attorney, Agent, or Firm*—Bachman & LaPointe

[57] ABSTRACT

The apparatus for treating small items is provided with a workbench surface which is supplied with air from above from a flow space and which is sealingly surrounded by a double-wall housing. The housing forms continuously extending flow cross-sections at edges of the surface. Disposed in front of the housing wall is a partition which defines therewith the flow cross-sections and forms in the interior of the housing a deflection edge at a spacing from the workbench surface.

10 Claims, 2 Drawing Sheets

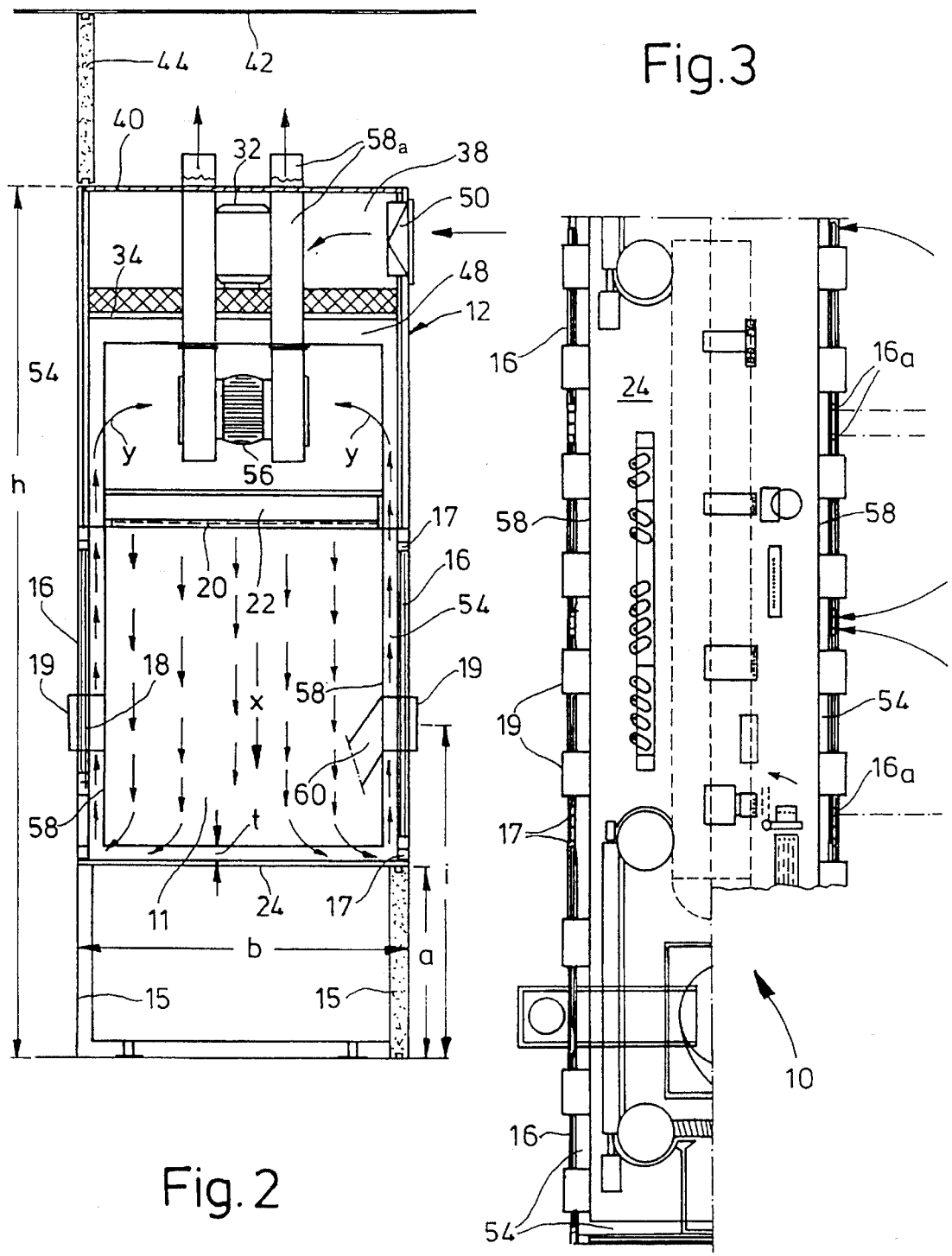

METHOD OF GUIDING AIR IN AN ACCOMMODATION SPACE AND APPARATUS FOR DEALING WITH SMALL PARTS

RELATED APPLICATIONS

This is a continuation of application Ser. No. 08/175,101 filed Dec. 29, 1993.

BACKGROUND OF THE INVENTION

The present invention relates to an apparatus for treating items on a workbench in a controlled environment.

Ever increasing levels of requirement in regard to room conditions and in particular room cleanliness are made for the treatment of very small items, for example products in the pharmaceutical industry, the timepiece industry or in computer technology. The conventional clean-rooms have been found to be defective in many cases as production areas with air-lock doors for the personnel, in particular when personnel movement results in disadvantageous flow conditions in the working area.

The specification of German Utility Model No. 1 821 926 describes a pressure-resistant steel vessel as a test chamber for building materials with horizontal air guide means which extend within the vessel and through which air is introduced laterally into the test chamber and is removed at the rear side thereof. In that arrangement there are two horizontal air circuits which come together in the test chamber. That steel vessel cannot afford an improvement in the conditions for clean-rooms.

Also known are open laboratory cubicles with perforated bench surface, through which the exhaust or waste air is sucked away downwardly.

SUMMARY OF THE INVENTION

With knowledge of that state of the art the inventor set himself the aim of providing an improved air guidance arrangement for clean-rooms and in particular an apparatus with which it is possible to operate under particularly advantageous conditions in a clean-room atmosphere.

The foregoing object is achieved by providing an apparatus for treating items in a controlled environment comprising an apparatus for treating items in a controlled environment comprising: a housing having longitudinal sidewalls defining a flow space means, the longitudinal sidewall means having vertically disposed air passage means; a horizontal bench plate surface for supporting the items disposed in the housing, the horizontal bench plate surface having edges which contact the longitudinal sidewall means and the vertically disposed air passage means; means for feeding air from above the horizontal bench plate surface such that the air impinges on the horizontal bench plate surface is deflected by the horizontal bench plate surface toward the longitudinal sidewall means and carried away by the air passage means.

In accordance with the invention the air is to be guided from above on to the surface of the accommodation or receiving space which is sealingly closed off relative to the environment, and diverted over the surface to the edge regions thereof at which the air is then carried away by conduit spaces defined by the edge regions. Continuously extending flow cross-sections are to be used as the conduit spaces and in addition the air is to be uniformly sucked away at least at the longitudinal edges of the surface over the entire length thereof.

In accordance with a further feature of the invention the air, at least at the surface and in the manipulation region, is guided in a laminar flow over that surface.

That procedure provides, above the surface on which the parts to be treated are disposed, a particularly smooth air guidance effect which makes it possible to manipulate or deal with even very light and small parts, without being affected by the air.

It has also been found to be advantageous for the air to be caused to flow to the working surface in a conditioned state, for example for the air to be warmed or for it to be charged with particular treatment agents which are mixed with the air in dependence on the respective operating process being performed.

An apparatus of the kind set forth in the opening part of this specification, which is particularly suitable for carrying out the described method, is distinguished in that the surface which is preferably in the form of a closed workbench is sealingly surrounded by a double wall housing which forms flow cross-sections at edges of the surface, wherein arranged above the surface and at a spacing therefrom is a flow space which feeds air thereto in a uniformly distributed manner.

Deflection edges of the inside wall of the double-wall housing, which inside wall is in the form of a partition, extend in parallel relationship with the above-mentioned edges of the surface or edge regions, at a comparatively small spacing. That deflection edge can even be designed to be displaceable in respect of height, within limits, for fine adjustment of the flow.

Advantageously, the housing is provided at its longitudinal walls with at least one viewing window and manipulation hose arms or the like flexible gripping members which pass through the viewing window and the flow cross-section; in addition a partition which is transparent at least in the region of the viewing window is to be arranged in front of the longitudinal wall of the housing, which partition with the longitudinal wall of the housing defines the flow cross-section and preferably extends in the interior of the housing and at a gap from the surface.

Having regard to the wish for a simple and compact very clean clean-room station, the surface, as indicated, is in the form of a bench surface which is provided with conveyor elements and which can be reached from the exterior by way of the manipulation hose arms and at each of the edges of which extend respective continuously extending flow cross-sections; in particular a flow cross-section is to extend around the bench surface. That provides a usable working station, in particular a filling installation for pills or the like pharmaceuticals, which takes account of the conditions specified in accordance with the stated object.

In order to improve the design of the structural unit, a fan is to be arranged upstream of the flow chamber which feeds air, in the flow direction, and the fan is to be disposed in a fan housing which is mounted above the interior of the housing of the apparatus; extending under the fan is an air guide or baffle plate while disposed beneath the latter in turn is a grid plate for distributing the air, as a closure means, at the bench side, for the flow space.

BRIEF DESCRIPTION OF THE DRAWINGS

Further advantages, features and details of the invention will be apparent from the following description of a preferred embodiment and with reference to the drawing in which:

FIG. 2 is a view in cross-section through FIG. 1 taken along line 11—11 therein; and FIG. 3 is a plan view of a part of the filling line taken along section line 111—111 in FIG. 1.

DETAILED DESCRIPTION

Figure 1:
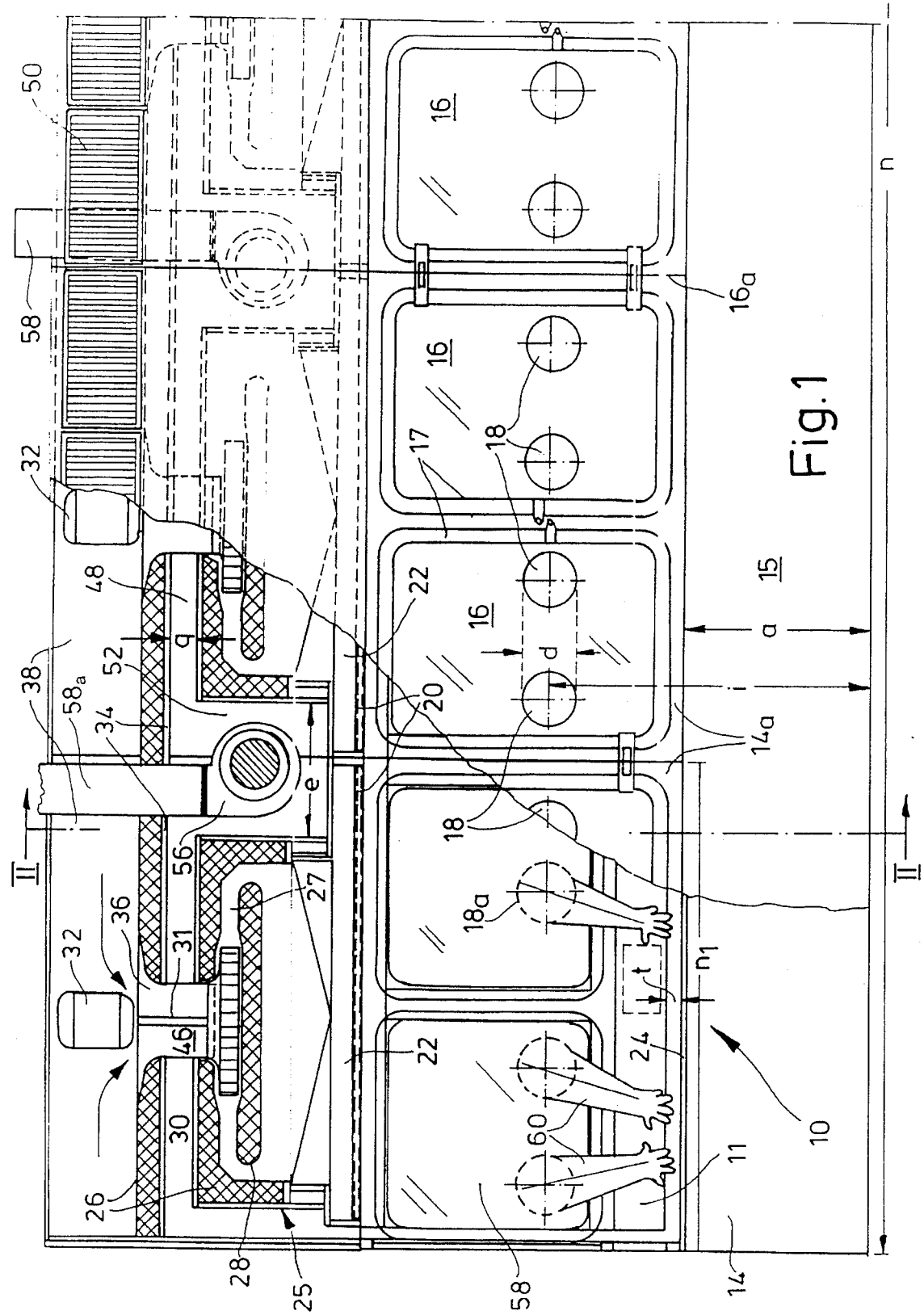
FIG. 1 is a partly sectional side view of a portion of a filling line.

A filling line 10 for manipulation with small and very small parts in a highly clean clean-room atmosphere has an air-tight parallelepipedic housing 12 of—in the illustrated embodiment—a length n of 550 cm, a height h of 300 cm and a width b of 120 cm, in which viewing windows 16 are provided at each of the longitudinal walls 14 of the housing. The longitudinal walls 14 of the housing each comprise a continuous base plate 15 of a height a of 70 mm and fitted thereon wall portions 14a of a length nl with two viewing windows 16. The end walls 13 of the housing 12 may also be provided with viewing windows 16.

Each of the viewing windows 16 is provided with at least one opening 18 of circular contour and an annular sleeve or cuff 19 which surrounds same and whose diameter d measures about 25 cm while the spacing of its center from the ground, as indicated at i, is about 120 cm. A frame 17 which is disposed around the sealingly closing viewing window 16 which is fitted pivotably about an axis 1a terminates in an upward direction near a grid plate 20 as a lower ceiling portion for a horizontal air feed passage 22; a plurality of those grid plates 20 define in an upward direction a filling space 11 which accommodates conveyor means or the like and which on the other hand terminates beneath the frame 17 at a horizontal bench plate 24.

The air feed passage 22 extends beneath a fan housing 25 with insulating cladding 26 for a fan wheel or impeller 30 which rotates above a guide or baffle plate 28 which distributes the air. The fan drive 32 thereof is disposed above a cover plate 34 with central opening 36 therethrough for the fan shaft 31 in a head space 38; extending over the latter is a ceiling plate 40 of the housing 12, which plate 40, as shown in FIG. 2, can be connection to a room ceiling 42 by a vertical screen member 44.

Disposed in the opening 36 is a tubular lining 46 which extends through an intermediate space 48 between the fan housing 25 and the cover plate 34, the height 2 of the intermediate space 48 being somewhat more than 10 cm. The lining 46 terminates within the fan housing 25. The fan wheel 30 draws air through filter plates or panels 50 provided in the longitudinal wall 12 of the housing above the cover plate 34 and passes it into the head space 38; the air passes through the tubular lining 46 into the gap 27 defined by the fan housing 25 and the guide or baffle plate 28, and from there into the air feed passage 22. From there the air drops in the direction indicated by the arrow x in FIG. 2 downwardly to the bench plate 24.

A plurality of the above-mentioned intermediate spaces 48, with respective air spaces 52 arranged between a respective pair of fan housings 25 disposed at a spacing e, form an air guide passage for exhaust or waste air. That air is drawn from the table plate 24 into a flow cross-section 54 of the longitudinal wall 14 of the housing—and in a corresponding fashion also the end wall 13 of the housing—and rises in same to the air guide passage 48/52. It passes within the air space 52 to a fan 56 and is discharged in vertical exhaust air pipes 58 above the ceiling plate or panel 40.

The flow cross-section 54 is defined outwardly by the described longitudinal wall 14 of the housing—or the end wall 13 of the housing—with the viewing windows 16 thereof, and towards the filling space 11 by a transparent partition 59 which in turn has openings 18a connected to the annular cuff 19 and terminates at the lower deflection edge 60 thereof at a spacing t, which measures about 100 mm, from the bench plate 24. On the inside the annular cuff 19 is extended in a flexible air-tight sleeve-glove 62 of translucent material as a manipulation hose arm.

In the filling space or chamber 11, any turbulence is avoided on the bench plate 24, due to the air which has been subjected to preliminary conditioning and which moves downwardly in the cross-section of the filling space or chamber 11. The small parts disposed on the closed bench plate 24 of the conveyor means are handled from the exterior under laminar flow conditions; by virtue of the described air guidance effect, almost ideally turbulence-free flows occur, for which Bernoulli's equation applies, while the Torricellian discharge flow law correspondingly applies in regard to the outwardly flowing air (arrow y in FIG. 2).

We claim:

1. An apparatus for treating items in a controlled environment comprising: a housing having longitudinal sidewalls defining a flow space means, said longitudinal sidewall means having vertically disposed air passage means; a horizontal bench plate surface for supporting said items disposed in said housing, said horizontal bench plate surface having edges which contact said longitudinal sidewall means and said vertically disposed air passage means; means for feeding air from above said horizontal bench plate surface such that said air impinges on said horizontal bench plate surface is deflected by said horizontal bench plate surface toward said longitudinal sidewall means and carried away by said air passage means.

2. An apparatus according to claim 1 including a partition disposed in front of the longitudinal sidewall means of the housing which defines therewith the air passage means.

3. An apparatus according to claim 2 wherein the partition extends from the longitudinal sidewall means into the interior of the housing and includes a deflection edge at the horizontal bench plate surface which forms therewith a gap for receiving the deflected air.

4. An apparatus according to claim 3 including means for adjusting the deflection edge vertically so as to control the size of the gap.

5. An apparatus according to claim 1 wherein the horizontal bench plate surface is surrounded by the air passage means.

6. An apparatus according to claim 1 wherein said means for feeding air includes a fan arranged upstream of the flow space, the fan being disposed in a fan housing mounted above the flow space.

7. An apparatus according to claim 6 wherein the fan is connected to a head space provided with air accesses for conditioning inserts.

8. An apparatus according to claim 6 wherein a fan device is disposed between adjacent fan housings.

9. An apparatus according to claim 2 wherein the housing is provided at its longitudinal sidewall means with at least one viewing window and manipulation means pass through the viewing window.

10. An apparatus according to claim 1 wherein the horizontal bench plate surface is provided with conveyor elements.

* * * * *